United States Patent
Avram et al.

(10) Patent No.: US 7,141,972 B2
(45) Date of Patent: Nov. 28, 2006

(54) WATER-FAT SEPARATION FOR FAST SPIN ECHO IMAGING IN AN INHOMOGENEOUS FIELD WITH PROGRESSIVE ENCODING

(75) Inventors: Hector C. Avram, Foster City, CA (US); Ilya S. Simovsky, Redwood City, CA (US)

(73) Assignee: Toshiba America MRI, Inc., Tustin, CA (US)

( * ) Notice: Subject to any disclaimer, the term of this patent is extended or adjusted under 35 U.S.C. 154(b) by 54 days.

(21) Appl. No.: 10/981,739

(22) Filed: Nov. 5, 2004

(65) Prior Publication Data

US 2005/0122105 A1    Jun. 9, 2005

Related U.S. Application Data

(60) Provisional application No. 60/520,321, filed on Nov. 17, 2003.

(51) Int. Cl.
*G01V 3/00* (2006.01)
(52) U.S. Cl. ..................... 324/309; 324/307
(58) Field of Classification Search ........ 324/307, 324/309, 414, 318, 319, 312, 300; 600/414, 600/410
See application file for complete search history.

(56) References Cited

U.S. PATENT DOCUMENTS

| | | | |
|---|---|---|---|
| 4,581,582 A * | 4/1986 | Redington | 324/309 |
| 4,661,775 A * | 4/1987 | Kormos et al. | 324/307 |
| 5,162,737 A * | 11/1992 | Nozokido et al. | 324/309 |
| 5,225,781 A | 7/1993 | Glover et al. | |
| 5,321,359 A * | 6/1994 | Schneider | 324/307 |
| 5,722,409 A * | 3/1998 | Kuhara et al. | 600/410 |
| 5,994,902 A * | 11/1999 | Xiang et al. | 324/307 |
| 6,091,243 A * | 7/2000 | Xiang et al. | 324/307 |
| 6,369,568 B1 | 4/2002 | Ma et al. | |
| 6,700,375 B1 | 3/2004 | Machida et al. | |
| 6,782,286 B1 | 8/2004 | Miyazaki | |
| 2003/0169042 A1 | 9/2003 | Feinberg et al. | |
| 2003/0193335 A1 | 10/2003 | Patch et al. | |
| 2004/0010191 A1 | 1/2004 | Yatsui | |
| 2004/0064032 A1 | 4/2004 | Ma | |
| 2004/0135578 A1 | 7/2004 | Peters et al. | |

OTHER PUBLICATIONS

Radiology, vol. 181, 597-602, Copyright © 1991 by Radiological Society of North America (pp. 1-3).
American Journal of Neuroradiology 20:1382-1383 (Aug. 1998) © 1998 American Society of Neuroradiology (pp. 1-5).
A.C.S. Chang et al. Medical Image Analysis 6 (2002) 109-128.

* cited by examiner

*Primary Examiner*—Brij B. Shrivastav
(74) *Attorney, Agent, or Firm*—Nixon & Vanderhye P.C.

(57) ABSTRACT

A method to separate two chemically-shifted components of water (w) and fat (f) signals by: (i) estimating the field inhomogeneity β through a treatment of the residuals of the Moore-Penrose solution of the following equations: $\cos(\alpha_n\beta)*w + \cos[\alpha_n(1+\beta)]*f = \text{real}(I_n)$ and $\sin(\alpha_n\beta)*w + \sin[\alpha_n(1+\beta)]*f = \text{imaginary}(I_n)$, and (ii) using the estimated β to determine the resulting solution for w and f from the original input signals $I_n$.

31 Claims, 13 Drawing Sheets

2D model used in all numerical experiments.

N = 5, $\alpha_n$ = {0°, 15°, 30°, 45°, 60°}, noise = 0, water, fat, $\beta$

N = 5, $\alpha_n$ = {0°, 15°, 30°, 45°, 60°}, noise = .5%

N = 5, $\alpha_n$ = {0°,30°,60°,90°,120°}, noise = 1%

N = 5, $\alpha_n$ = {0°, 30°,60°,90°,120°}, noise = 2.5%

N = 5, $\alpha_n$ = {0°,30°,60°,90°,120°}, noise = 5%

$N = 3$, $\alpha_n = \{0°, 90°, 120°\}$, fat error versus number of repetitions.

$N = 3$, $\alpha_n = \{0°, 90°, 120°\}$, water error versus number of repetitions.

$N=3, \alpha_n=\{0°, 90°, 120°\}, M=3$ (noise = 2.5 %)

ic Resonance sections of a patient.

WATER-FAT SEPARATION FOR FAST SPIN ECHO IMAGING IN AN INHOMOGENEOUS FIELD WITH PROGRESSIVE ENCODING

RELATED APPLICATION

This application claims is a continuation of and claims priority of U.S. provisional application Ser. No. 60/520,321 filed on Nov. 17, 2003, the entirety of which is incorporated by reference.

BACKGROUND OF THE INVENTION

This invention generally relates to Magnetic Resonance Imaging (MRI) and, in particular, to a method and apparatus for water-fat image separation in MRI.

Fast spin echo (FSE) imaging offers fast acquisition with long repetition times (TR). FSE can be used to improve contrast of long transverse relaxation time (T2) image components with respect to short transverse T2 image components. In clinical applications, where water signals are chiefly of interest, it is desirable to attenuate or eliminate MR signals from lipids (the terms "lipid" and "fat" are used interchangeably) which tend to reduce image contrast especially in the extremities and abdominal sections of a patient. The loss of water image contrast due to lipids is also exasperated by the natural behavior of the FSE sequence to enhance the lipid signal by partial averaging the scalar J-coupling of the lipid protons. The J-coupling signal enhancement becomes progressively worse as refocusing pulses are repeatedly applied during the FSE imaging echo train. Lipid signal levels tend to be relatively intense because of partial averaging in FSE sequences especially when they have long effective echo times (TE) and short echo spacing.

Conventional approaches to attenuate lipid signals include: chemically selective radio frequency (RF) preparation, saturation, and excitation pulses, inversion recovery preparation pre-pulse such as in short tau inversion recovery (STIR) and multipoint Dixon techniques. Chemically selective RF pulses are dependent on the homogeneity of the main magnetic field. For successful application of chemically selective RF pulses, magnetic field homogeneity of one (1) part per million [ppm] or better is typically needed to effectively attenuate lipids during image acquisition. Such high levels of main field homogeneity are not always achievable over the entire field of view (FOV) being imaged. Even where shimming of the main magnetic field provides field homogeneity under 1 ppm, small field inhomogeneities can occur in certain anatomical areas being imaged. For example, a discontinuity of magnetic susceptibility of several ppm can occur at tissue-to-tissue and tissue-to-air interfaces. Furthermore, at mid and low magnetic field strengths, the actual frequency difference between water and lipid signals is so small that impractically long RF pulse lengths are needed to discriminate between the water and lipid signals.

An inversion recovery preparation pre-pulse, e.g., STIR, to prepare the subject region for acquisition is simple and easy to implement. A difficulty with STIR is the loss of signals from tissues that have longitudinal relaxation times (T1) which are similar to the T1 of the attenuated lipids. At mid-field strengths, typical values of T1 for muscle, brain, cerebrospinal fluid (CSF) and lipids are: 450, 600, 3500 and 220 milliseconds (ms) respectively. Although lipids have the fastest relaxations, the recovery curve after an inversion pre-pulse at an evolution time of about 100 to 150 ms removes significant amounts of signal from the water components which reduces the overall conspicuity of many features of clinical importance.

Phase sensitive methods have been applied to distinguish water and lipid signals. These methods rely on the phase increment of the water signals relative to lipid signals in a homogeneous field. Within the small volume of a single image volume element (voxel) the main field can be treated as uniform even though it is not so over the entire image field of view. The phase increment α is given in radians by the following relationship (1):

$$\alpha = 2\pi * \Delta F_0 * \Delta t \qquad (1)$$

where $\Delta F_0$ is the water-lipid chemical shift in hertz (Hz) and $\Delta t$ is the evolution time in seconds (sec). The evolution time is measured from the echo formation to a point where the first order interactions are canceled out, such as at the nominal time TE or at a multiple of TE for each echo in the sampling window. In a typical fast spin echo sequence, TE is also the time distance between refocusing pulses and TE/2 is the time between the 90 degree excitation and the first refocusing pulse.

When echo formation occurs at a time different from the mid-point between the refocusing pulses, a water-lipid phase difference is generated for every voxel in the imaging volume. The water-lipid phase difference may be used to distinguish the water and lipid signals, and thereby facilitate attenuation of the lipid signals. The water-lipid phase difference may be relatively small or be obscured by inhomogeneties in the static magnetic field. In the past, identifying and using the water-lipid phase difference to attenuate lipid signals has been problematic. There remains a long felt need for improved phase sensitive methods to suppress lipid signals and thereby improve MR images.

BRIEF SUMMARY OF THE INVENTION

A standard fast spin echo sequence (FSE) has been modified to obtain substantial phase increments between water and lipid signals. This modification is applicable to two-dimensional (2D) sequences, three-dimensional (3D) or higher dimension FSE sequences. The Carr Purcell Meiboom Gill Sequence (CPMG) phase condition is preserved by maintaining symmetry such that all echoes (direct and indirect) are spatially phase encoded in the same manner for the entirety of the echo train. Symmetry may be accomplished by moving the set of gradient waveforms that are composed of the readout sampling and the surrounding phase encoding (imaging) gradient pulses solidly between the refocusing RF pulses. With this approach, the point of echo formation varies to the same degree for all echoes. This approach preserves the echo train symmetry for all possible refocusing angles.

Progressive encoding is performed by shifting all echoes in a FSE sequence by various time differentials to gather water-lipid phase encoding information. An algorithm has been developed to calculate water and lipid images based on a least-squares solution space for magnetic field inhomogeneity, which may be treated as a two-point field space. Because inhomogeneities in the field tend to change slowly from voxel to voxel, the most smooth least squares solution space is chosen of all available solution spaces. The chosen solution space may further be smoothed by fitting a polynomial curve to the solution space. This approach is suitable for water-lipid image separation where the induced error varies with the phase increment between water and lipid signals.

The invention may be embodied as a method for magnetic resonance imaging of a subject separating two moieties of differing chemical shift in the presence of a non-uniform magnetic field comprising the steps of: (i) acquiring at least three complete sets of MRI data using a series of fast spin echo (FSE) sequences in which the readout gradient waveform is shifted to produce sets of MRI data that are similarly spatially encoded, and wherein each of the three sets has different signal timing to produce three different phase shifts between two chemically shifted signals and wherein one of the phase differences ($\alpha_0$) is substantially zero; (ii) generating at least three complex image data sets by reconstructing images from the at least three data sets; (iii) using the at least three complex image data sets, two at a time, to generate two solutions for a separate image of w and f signals having different chemical shifts according to the following model:

$$|w+f^*\exp(i\alpha_n)|=|I_n|, n=0,1,\ldots,N-1,$$

where $\alpha_n$ is the induced phase shift between the w and f signals for each set (n) from which the two pairs of solutions for w and f may be determined; (iv) from the two pairs (with $n=\{0, n_1\}$ and $n=\{0, n_2\}$) of solutions for w and f and from the following equations $$\cos(\alpha_n\beta)^*w+\cos[\alpha_n(1+\beta)]^*f=\mathrm{real}(I_n)$$

$$\sin(\alpha_n\beta)^*w+\sin[\alpha_n(1+\beta)]^*f=\mathrm{imaginary}(I_n),$$

determine two pairs of solutions ($\{\beta_1^1, \beta_1^2\}$ and $\{\beta_2^1, \beta_2^2\}$) for the main magnetic field inhomogeneity ($\beta$) wherein solution $\{\beta_1^1, \beta_1^2\}$ is determined using the set of in-phase data and a data set having the largest $\alpha$ and the solution $\{\beta_2^1, \beta_2^2\}$ is determined using the in-phase data set and a data set having the second largest $\alpha$; (v) selecting a unique solution for $\beta$ from $\{\beta_1^1, \beta_1^2\}$ and $\{\beta_2^1, \beta_2^2\}$; (vi) select one of $\beta_1^1$ and $\beta_1^2$ having a minimum distance among the following:

$$|\beta_1^1-\beta_2^1|, |\beta_1^1-\beta_2^2|, |\beta_1^2-\beta_2^1|, |\beta_1^2-\beta_2^2|,$$

and, (vii) applying the selected $\beta$ to determine a final solution for w and f.

The method described above may also use MRI data to solve for $\beta$ from more than three data sets, e.g., four or five sets, and the method is not limited to only three data sets (which are the two sets with the largest phase shifts and an in-phase set).

The method may be applied using three rapidly acquired echoes within one scan, and if the echoes are closely spaced they can all be acquired between each 180 degree pulse. For example, the may be applied using a gradient echo readout sequence and rapidly reversing the readout gradient to produce the requisite phase shifted echoes. In addition, rapid readout reversals may be applied to produce the phase shifted echoes within a conventional spin echo or field echo sequence.

In addition, the method may be applied using three separate MRI scans. Further the method may be performed on three or more image data sets that are three dimensional (3D) image data sets.

The invention may also be embodied as a method to separate two chemically-shifted signal components w and f comprising: (i) estimating a main magnetic field inhomogeneity ($\beta$) using a heavy spatially low-pass filtered input signal ($I_n$) applied to the following equations:

$$\cos(\alpha_n\beta)^*w+\cos[\alpha_n(1+\beta)]^*f=\mathrm{real}(I_n)$$

$$\sin(\alpha_n\beta)^*w+\sin[\alpha_n(1+\beta)]^*f=\mathrm{imaginary}(I_n)$$

assuming that for the heavy low-pass filtered input signal the w to f ratio is approximately constant and applying the estimated field inhomogeneity ($\beta$) to separate the w and f signals in a non-filtered MRI input signal.

DETAILED DESCRIPTION OF EXEMPLARY EMBODIMENTS

Figure 1:
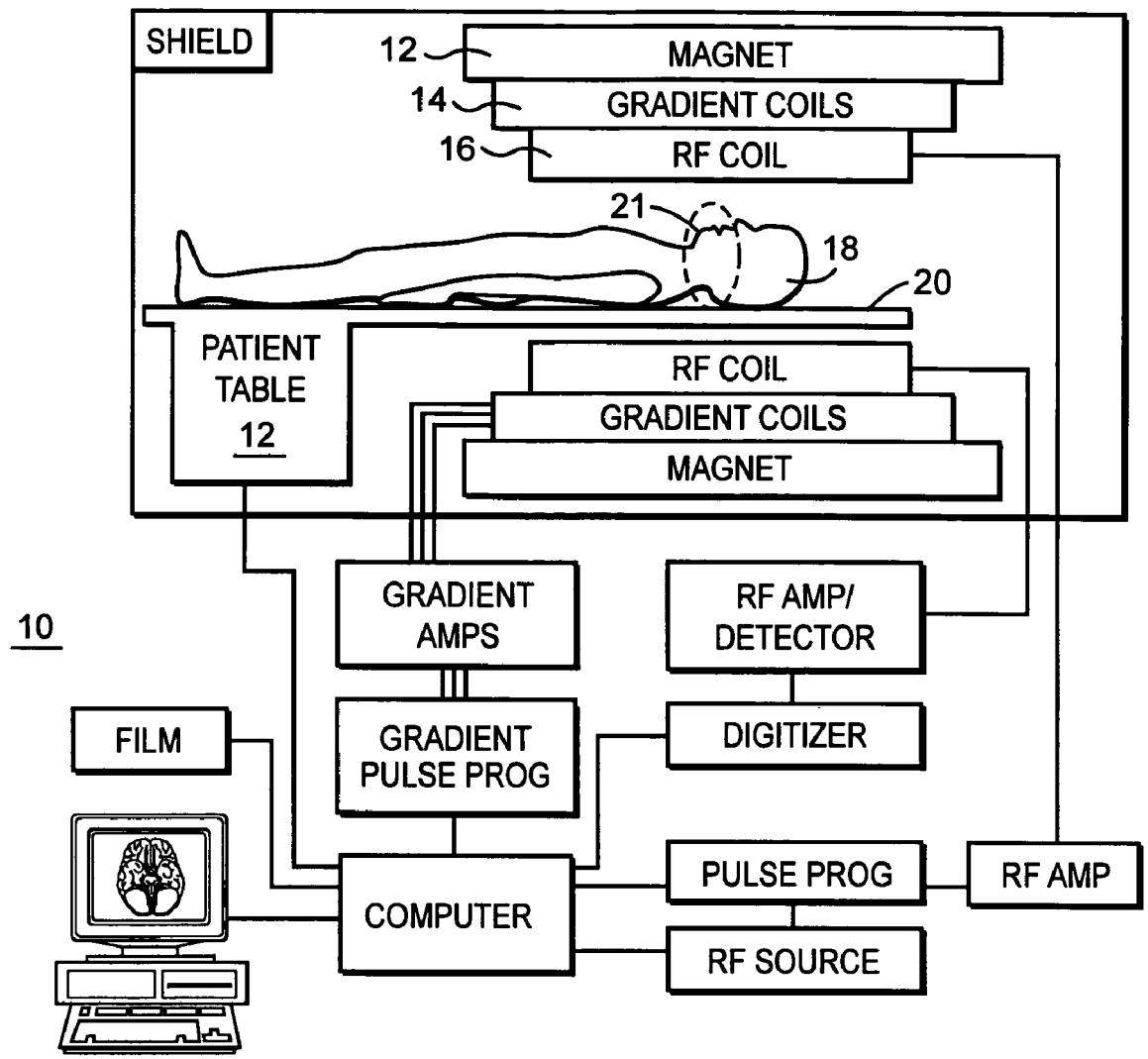
FIG. 1 is a schematic diagram of an MRI system.

FIG. 1 shows a typical MR imaging system 10 including a magnet 12 to impose a static magnetic field ($B_0$), gradient coils 14 for imposing spatially distributed gradient magnetic fields ($G_x$, $G_y$, and $G_z$) having gradients along three respective orthogonal coordinates, and RF coils 16 to transmit and receive RF signals to and from the selected nuclei of the body being imaged. The orthogonal gradients are applied to select a slice or other region of the body being imaged, to phase encode nuclei in the selected slice and to readout RF signals from the phase encoded nuclei. The patient 18 lies on a patient table 20 such that a portion of the patient to be imaged is in an "imaging volume" 21 between the magnet and coils, which defines a field of view (FOV) of the MRI system.

Figure 2:
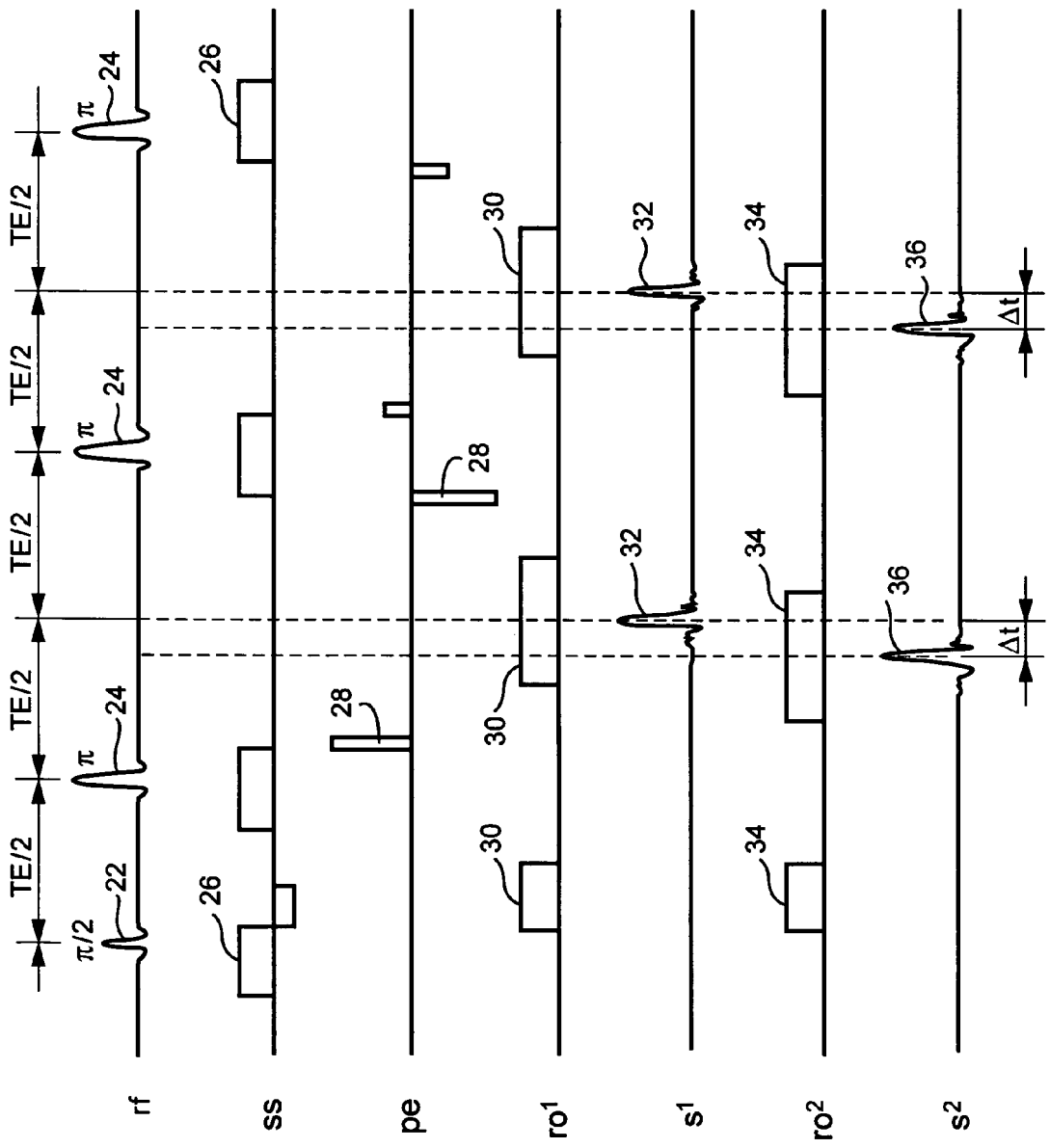
FIG. 2 illustrates a standard fast spin echo (FSE) superimposed with a shifted fast spin echo pulse sequence.

FIG. 2 shows a standard 2D fast spin echo (FSE) sequence (ro$^1$, s$^1$) and a shifted fast spin echo sequence (ro$^2$, s$^2$). Note that ro$^2$ and s$^2$ are shifted. As is conventional, a 90° ($\pi/2$) initial phase RF pulse 22 is followed by a series of rapidly applied 180° ($\pi$) refocusing RF pulses 24. Slice selection gradients 26 and phase encoding magnetic gradients 28 are applied in a conventional FSE-2D manner. The standard and shifted FSE sequences are operated in dynamic mode such that N successive scans are performed with various time shifts between the standard and shifted FSE sequences. RF phase coherence is maintained across all N scans such that the signals can be easily combined.

A first series of readout gradients (ro$^1$) 30 is applied to collect in-phase image data (s$^1$) 32. The first series of readout gradients are applied centered at a mid-point (TE/2) of the period (TE) between each pair of refocusing pulses. The effects of background magnetic field inhomogeneity in the in-phase data (s$^1$) cancel out at the time TE/2, which is measured from the center of the preceding refocusing pulse ($\pi$). The readout gradient (ro$^2$) for the shifted FSE is applied centered at a time TE/2 plus a certain time difference ($\Delta t$). The period of the time difference ($\Delta t$) progressively increases for each successive scan. Various order of varying $\Delta t$ may be applied.

The time shifted readout gradients (ro$^2$) 34 collect out of phase image data (s$^2$) 36. This data (s$^2$) has a certain water-lipid phase increment and a corresponding background inhomogeneity error associated with a time difference ($\Delta t$) relative to the corresponding echo point of the in-phase (s$^1$) image data. The time difference ($\Delta t$) is the period between the in-phase data signal (s$^1$) and the out-of-phase data signal (s$^2$). To ensure the same global RF phase at the beginning of each scan, the sequence runs in a mode that effectively locks the phase for all N scans used to generate the images. Each of the N scans has a level of phase increment value directly proportional to the time differential ($\Delta t$). By altering the time differential for successive dynamic scans (0,1,2, ... N-1), a series of water-lipid signals with different phase increment angles is obtained.

After standard FSE-2D processing, the complex voxel image data ($I_n$) is subjected to post processing. This post-processed image data is a heavy spatially low-filtered input signal that is acquired as three image data sets which are in turn processed to determine solutions for the main magnetic field inhomogeneity ($\beta$). The FSE water-fat imaging is based on the mathematical model (2) presented below:

$$(w+f^*\exp(i\alpha_n))^*\exp(i\alpha_n\beta)=I_n, \text{ where } n=0, 1, 2, \ldots, N-1 \quad (2)$$

The image data parameter $I_n$ is the complex input MR image data generated in the current voxel for the current phase angle, w is the MR part of the image data from the water component in the current image voxel, f is the part of the image data from the fat component of the current voxel, $\alpha_n$ is the n-th phase increment angle, and $\beta$ is the scalar magnetic field inhomogeneity coefficient. The scalar magnetic field inhomogeneity coefficient ($\beta$) is represented by $\Delta B_0/\Delta F_0$, where $\Delta B_0$ is field inhomogeneity in hertz (Hz) and $\Delta F_0$ is the chemical shift between water and fat in Hz.

For each given inhomogeneity coefficient $\beta$, the real-valued least-squares solution $\{w,f\}$ of the model (2) may be represented by the Moore-Penrose pseudo inverse of the system using the following system (3, 4):

$$\cos(\alpha_n\beta)^*w+\cos[\alpha_n(1+\beta)]^*f=\text{real}(I_n) \quad (3)$$

$$\sin(\alpha_n\beta)^*w+\sin[\alpha_n(1+\beta)]^*f=\text{imaginary}(I_n) \quad (4)$$

The residual of the Moore-Penrose solution of the system (3, 4) over a series of phase increment values (0, 1, 2, ... N-1) for a given $\beta$ is R($\beta$). Values for w, f and $\beta$ can be found by minimization of R($\beta$) over an interval ($\beta$min, $\beta$max). If w does not equal f, the function R($\beta$) has two close local minima which may cause the minimization process to be unstable. In particular, it is easy to select the wrong value for R($\beta$) minimum, especially in the presence of noise in the input data ($I_n$) and where the water/fat component ratio is small.

Figure 3:
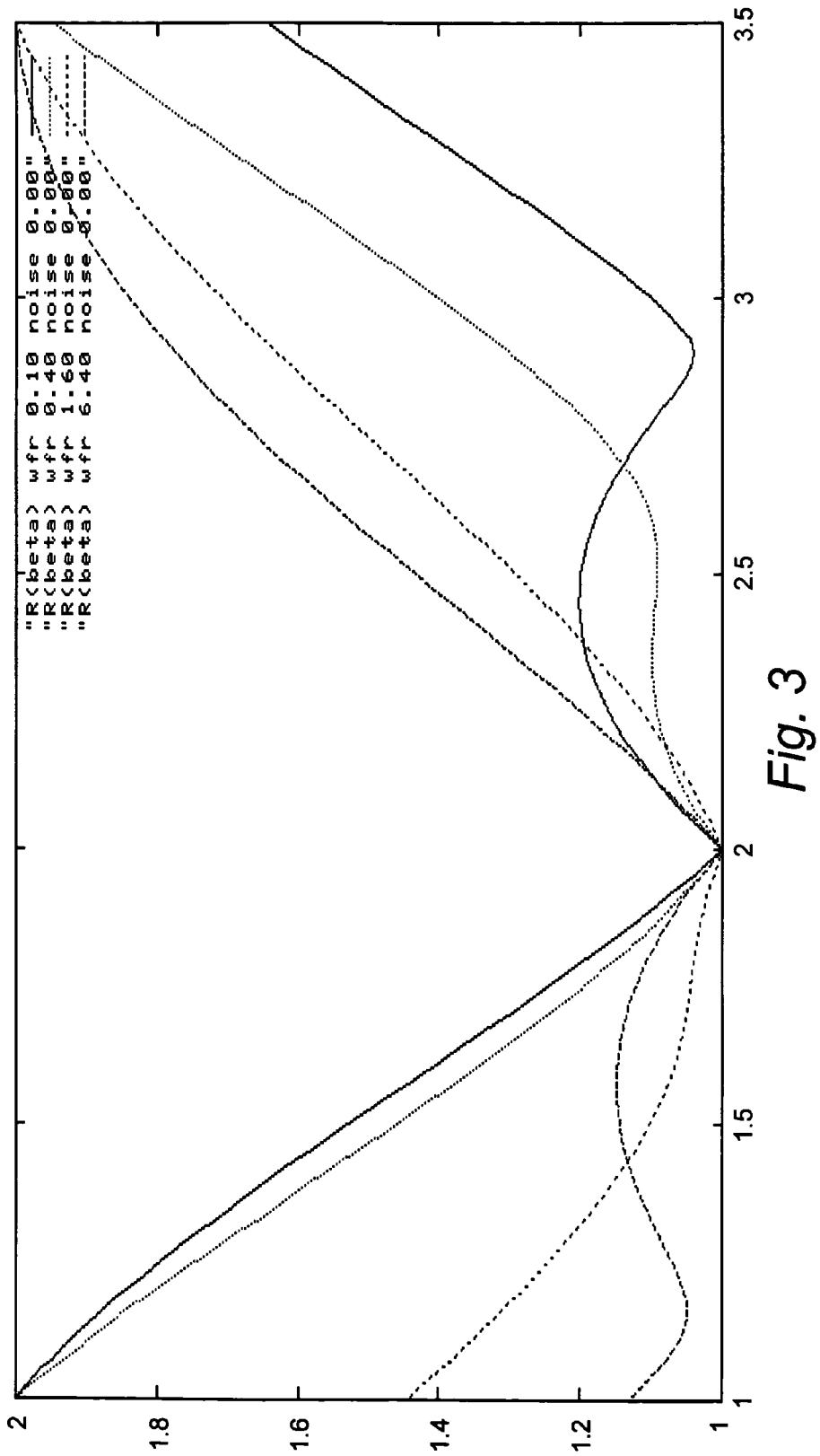
FIG. 3 illustrates error values for various water/fat component ratios (wfr) with zero noise added.
Figure 4:
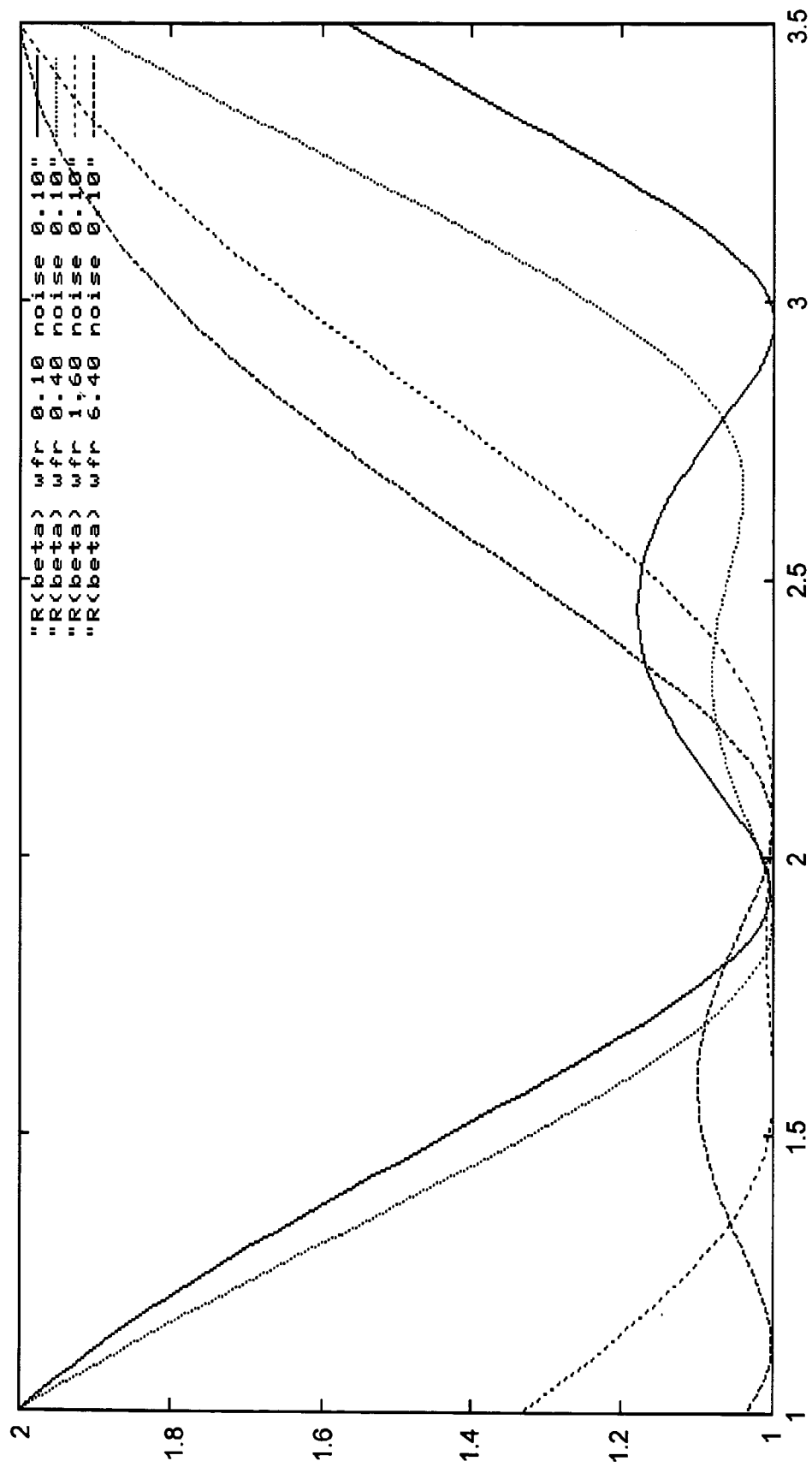
FIG. 4 illustrates the presence of 10% noise (relative to the mean total signal in the image) in the MR signal ($I_n$) and at various levels of wfr.

The difficulty in selecting the proper R($\beta$) minimum is illustrated by FIGS. 3 and 4. In FIG. 3, the function R($\beta$) is plotted with the following parameters: N=5, $\alpha_n=\{0°,30°,60°,90°,120°\}$. $I_n$ is simulated with $\beta$=2, using different w/f ratios (wfr) from 0.1 to 6.4, and no noise. In FIG. 4, the function R($\beta$) is plotted for similar parameters but where white noise has been added to $I_n$. The added noise has a root mean square amplitude which is ten percent of the mean signal amplitude over the whole field of the test object and surrounding zero fields. The real and imaginary parts of noise are mutually independent and have a bivariate normal (O, $\sigma$) distribution. This distribution creates the noise level (magnitude distribution mean) equal to 1.253 $\sigma$ and standard deviation equal to 0.655 $\sigma$. The phase of noise is distributed evenly on $\pm\pi$, intervals. In FIG. 4, the function R($\beta$) appears to have several different local minima. As is evident from FIGS. 3 and 4, it is difficult and tedious to select the proper minimum value for R($\beta$) especially when the input data ($I_n$) includes noise.

To mitigate the problem of noise in the input data ($I_n$), a less precise but more robust and direct method is proposed to select a minimum value for R($\beta$). For purposes of this direct method, assume first that N$\geq$3 and $\alpha_0$=0. Applying equation (5).

$$|w+f^*\exp(i\alpha_n)|=|I_n| \quad (5)$$

with n=$\{0, n_1\}$ and n=$\{0, n_2\}$, two pairs of solutions for w and f may be determined. From these two pairs of solutions for w and f and applying equations 3 and 4, solutions for $\beta$ may be determined as $\{\beta_1^1, \beta_1^2\}$ and $\{\beta_2^1, \beta_2^2\}$.

To select a unique solution for $\beta$ from $\{\beta_1^1, \beta_1^2\}$ and $\{\beta_2^1, \beta_2^2\}$, suppose that the first pair $\{\beta_1^1, \beta_1^2\}$ corresponds to the largest phase increment angle between $\alpha_{n1}$ and $\alpha_{n2}$. From $\beta_1^1$ and $\beta_1^2$, chose the one with the minimum distance among the following:

$$|\beta_1^1-\beta_2^1|, |\beta_1^1-\beta_2^2|, |\beta_1^2-\beta_2^1|, |\beta_1^2-\beta_2^2| \quad (6)$$

Again, as for minimization of R($\beta$) with the presence of noise, there is a certain possibility that the chosen solution for $\beta$ is wrong for a particular image data voxel. Since $\beta$ represents the magnetic field inhomogeneity, it should change very slowly from voxel to voxel and can be approximated with enough precision by a low order function, for example a cubic polynomial function, of the voxel position. The chosen solution for $\beta$ is fitted with a cubic polynomial over the whole slice or volume being imaged. In the case of N=2, there is only one pair of equations (5). In this case, between $\beta_1^1$ and $\beta_1^2$, choose the solution which minimizes the average residual of the Moore-Penrose solution of equation (2) in the neighborhood of the corresponding voxel. As for N$\geq$3, the chosen solution can be further fitted to a low order polynomial equation.

Numerical experiments for the two methods of selecting the local solution for $\beta$ described above found that the tedious process of searching for two local minima in R($\beta$) in the presence of $I_n$ noise yields results similar to the direct solution (such as shown by equations 5 and 6). The direct solution was used for further experiments. Even for the 2D-FSE sequence described herein, where efforts are made to decrease the fat signal, the fat signal is still sometimes 4–5 times stronger than the water signal. A 2D model test object was created comprising four similar squares with different ratios of the fat and water signal amplitudes. In relative units, the average water signal is 5,000, the average fat signal is 20,000 and the global average signal is 12,500.

The algorithm of water/fat separation can be described as follows: (i) Initially create a magnitude mask M(x,y) and β-mask B(x,y). These masks are initialized to one (1) at the points where the magnitude of the signal is above a selected multiple of the noise level, and to zero (0) where the signal is below that noise threshold level. (ii) For all points where M(x, y) equals 1, β(x,y) is calculated using a direct method. For those points where there are no positive solutions for w and f or where the solution for β is complex, the β-mask B(x, y) is set to 0. (iii) The function β(x,y) is least squares approximated by a cubic polynomial $\tilde{β}(x,y)$ over the points where B(x,y) equals 1. Assuming that the number of such points is more than the number of coefficients of a 2D cubic polynomial, e.g., 10, a system of 10 linear equations must be solved. (iv) For all points, where M(x,y) equals one 1, the water and fat images w(x,y) and f(x,y) are determined using $\tilde{β}(x,y)$ by the Moore-Penrose solution (of EQ. 2 and 3 above) with the restrictions that w and f are greater than zero.

Figure 5:
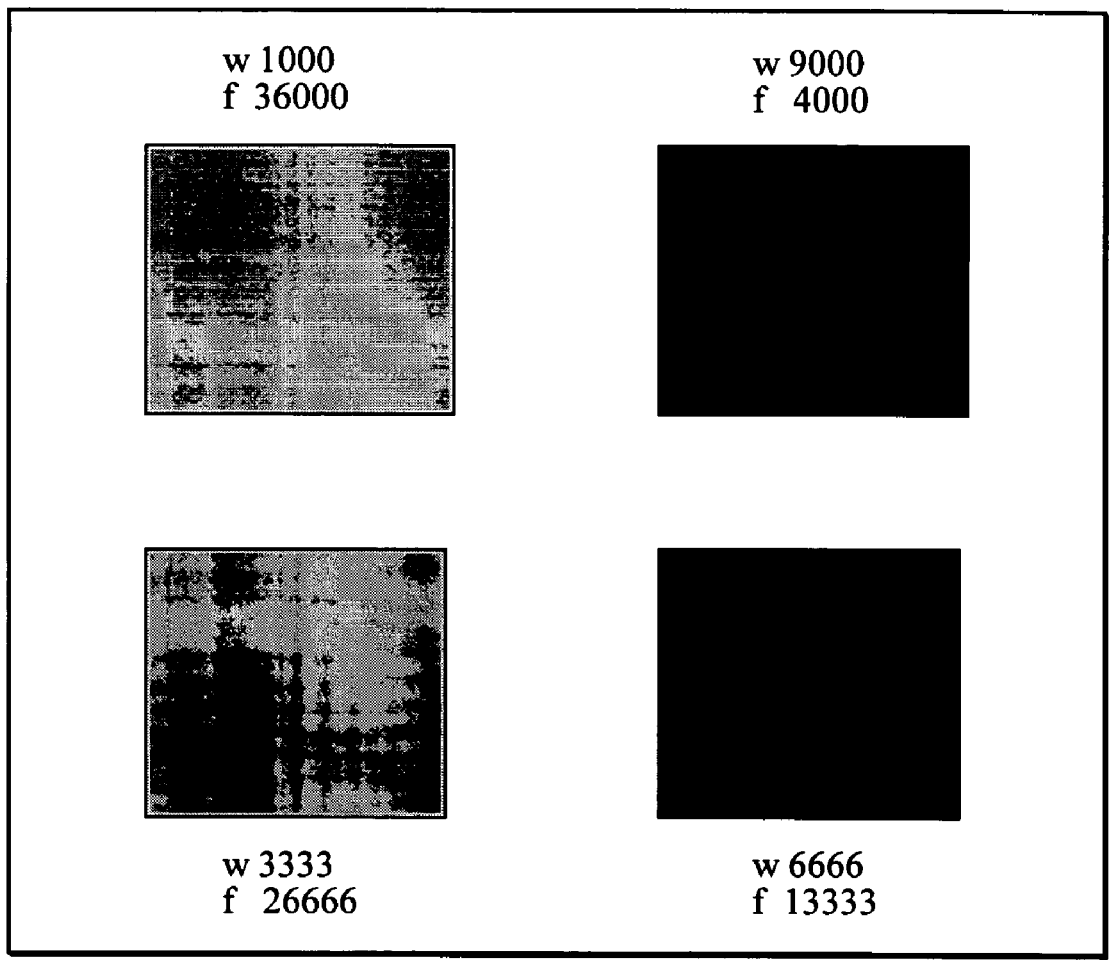
FIG. 5 illustrates a water-fat 2D model test object used in the numerical experiments presented herein.

The test object water and fat image data used in all numerical experiments are depicted in FIG. 5. For the first series of experiments, the input data $I_n(x,y)$ was simulated using equations (3 and 4) with the following parameters: N=5 and increment angles $α_n=δ*n$, $δ=α_{max}/(N-1)$, $α_{max}=\{60°,75°,90°,105°,120°,135°,150°,165°,180°\}$. The parameters (x,y) represent the voxel position in the image.

A white noise of a certain level was added to $I_n(x,y)$ to test the effects of noise on the images. The field inhomogeneity coefficient was modeled by the following cubic polynomial:

$$β(x,y)=a_0+a_1x+a_2y+a_3xy+a_4x^2+a_5y^2+a_6x^2y+a_7xy^2+a_8x^3+a_9y^3,$$

where $a_i=\{-2, 0.02368, 0.2368, 0, -0.000185, -0.000185, 0, 0, 4.81645e-7, 4.81645e-7\}$.

On the rectangle $x\subseteq[0,255]$, $y\subseteq[0,255]$, the value of β changes between -2 and 2.

Figure 6:
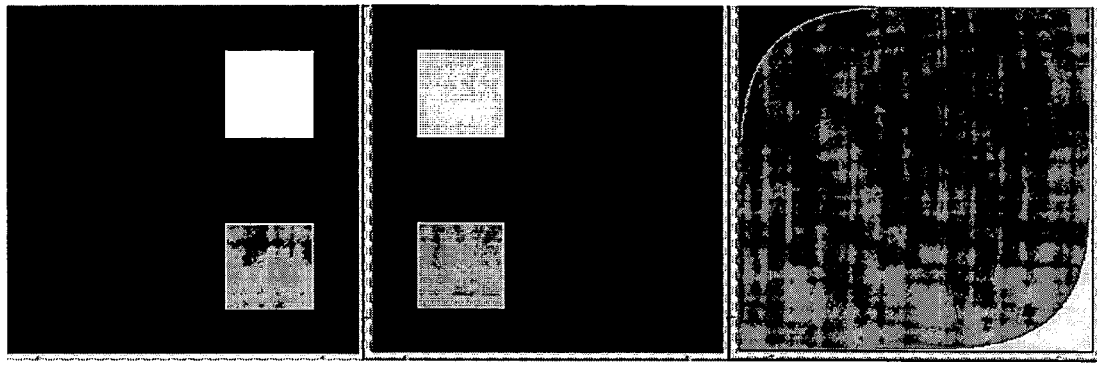
FIG. 6 illustrates a solution for water, fat and $\beta$, when N=5, $\alpha_n=\{0°,15°,30°,45°,60°\}$, noise=0.
Figure 7:
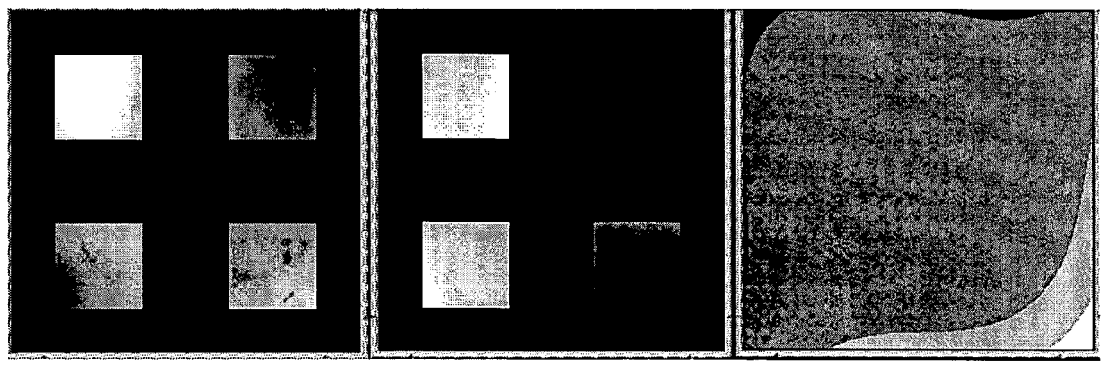
FIG. 7 illustrates a solution when N=5, $\alpha_n=\{0°,15°,30°,45°,60°\}$, noise=0.5%.
Figure 8:
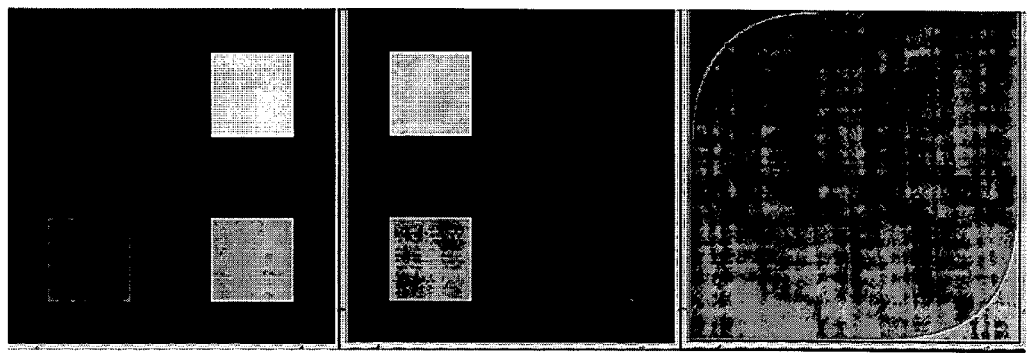
FIG. 8 illustrates a solution when N=5, $\alpha_n=\{0°,30°,60°,90°,120°\}$, noise=1%.
Figure 9:
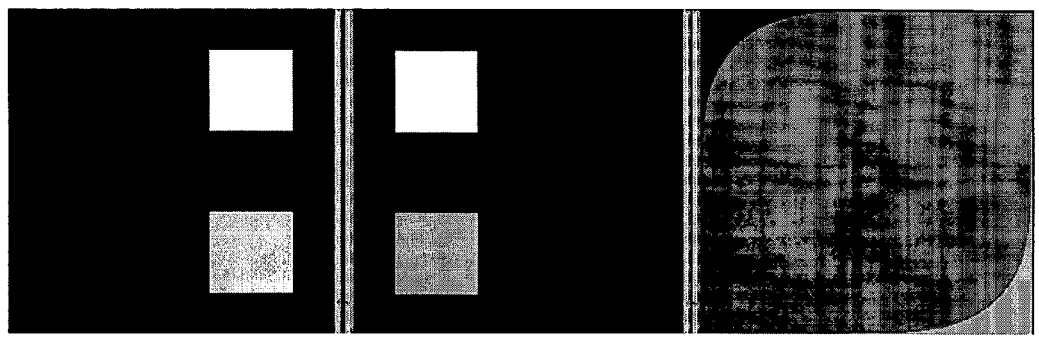
FIG. 9 illustrates a solution when N=5, $\alpha_n=\{0°,30°,60°,90°,120°\}$, noise=2.5%.
Figure 10:
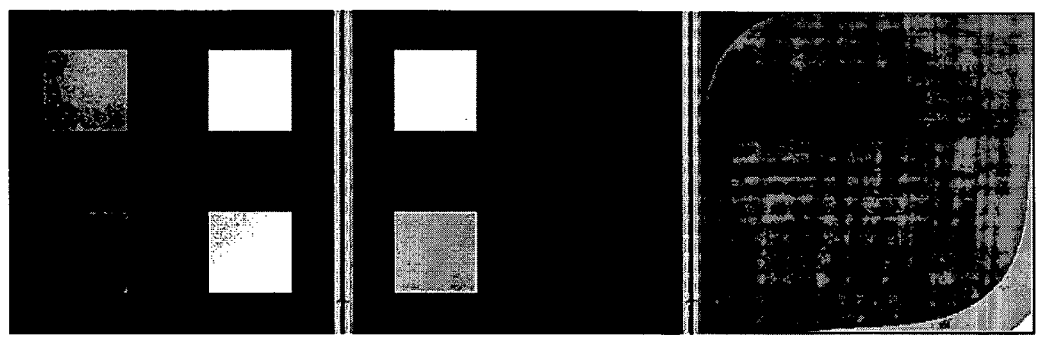
FIG. 10 illustrates a solution when N=5, $\alpha_n=\{0°,30°,60°,90°,120°\}$, noise=5%.

The results of the water/fat separation for $α_{max}=60°$ are presented in Table 1 and FIGS. 6 and 7. For $α_{max}=120°$, the results are presented in Table 2 and FIGS. 8 through 10.

The water/fat separation quality depends on the noise level in the input data and the values of increment angles and on the water/fat ratio. Table 1 and FIGS. 6 and 7 show that with N=5, $α_n=\{0°,15°,30°,45°,60°\}$ and noise as small as 0.5% of the average signal, there is a significant leak of the fat signal into the water in area 1. If the noise is greater than 1%, the proposed water/fat separation algorithm failed.

With $α_n=\{0°,30°,60°,90°,120°\}$ the results of the water/fat separation are acceptable with the noise level up to 2.5%. The larger the water are component in the total signal the better is the water/fat separation with respect to the water estimate. For areas 2–4 in Tables 1 and 2, the results of the water/fat separation are acceptable with the noise level in the input water signal up to 5%.

Figure 11:
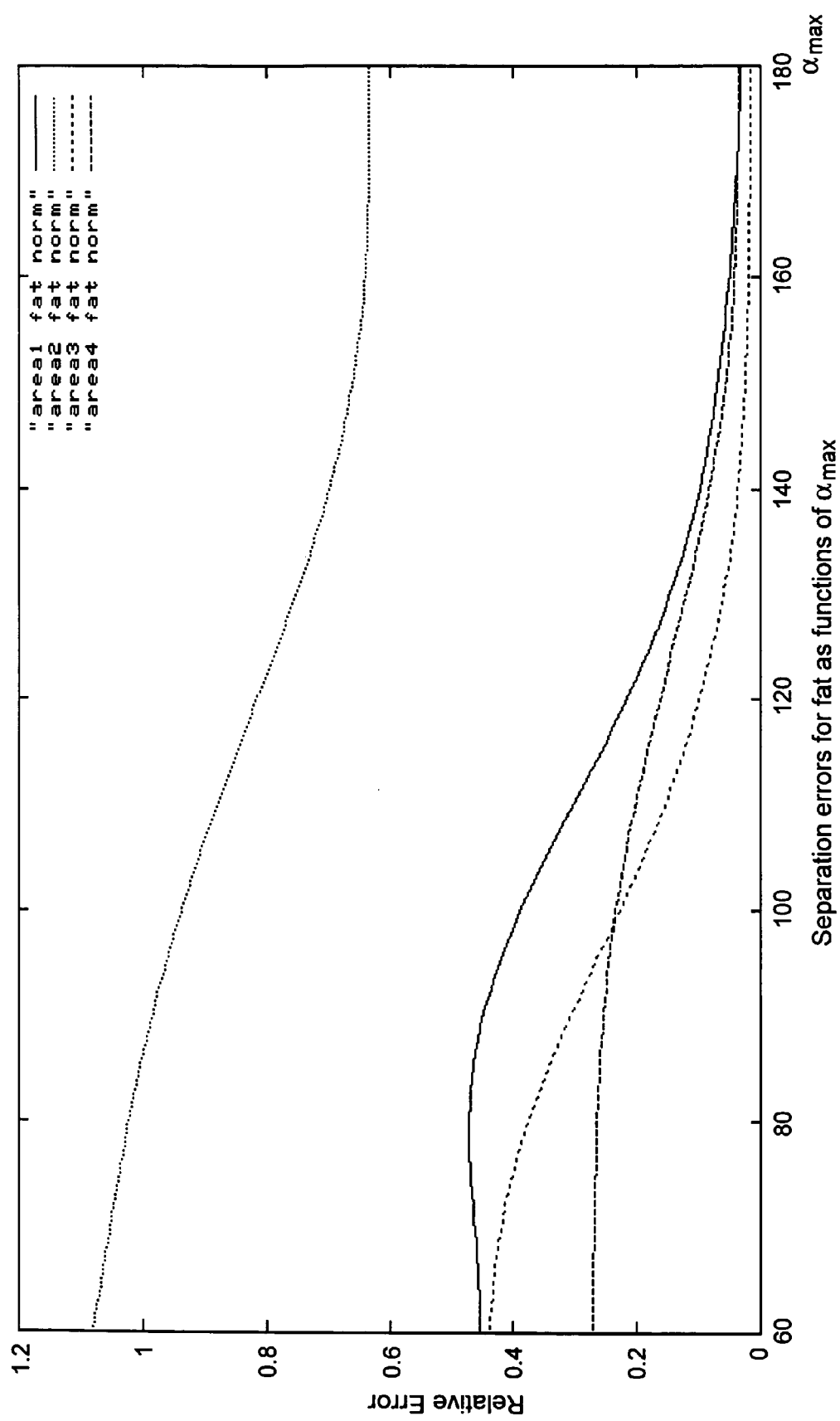
FIGS. 11 and 12 show calculated relative errors in each of water and fat separated images as a function of $\alpha_{max}$ when 10% noise was added to simulated input data.
Figure 12:
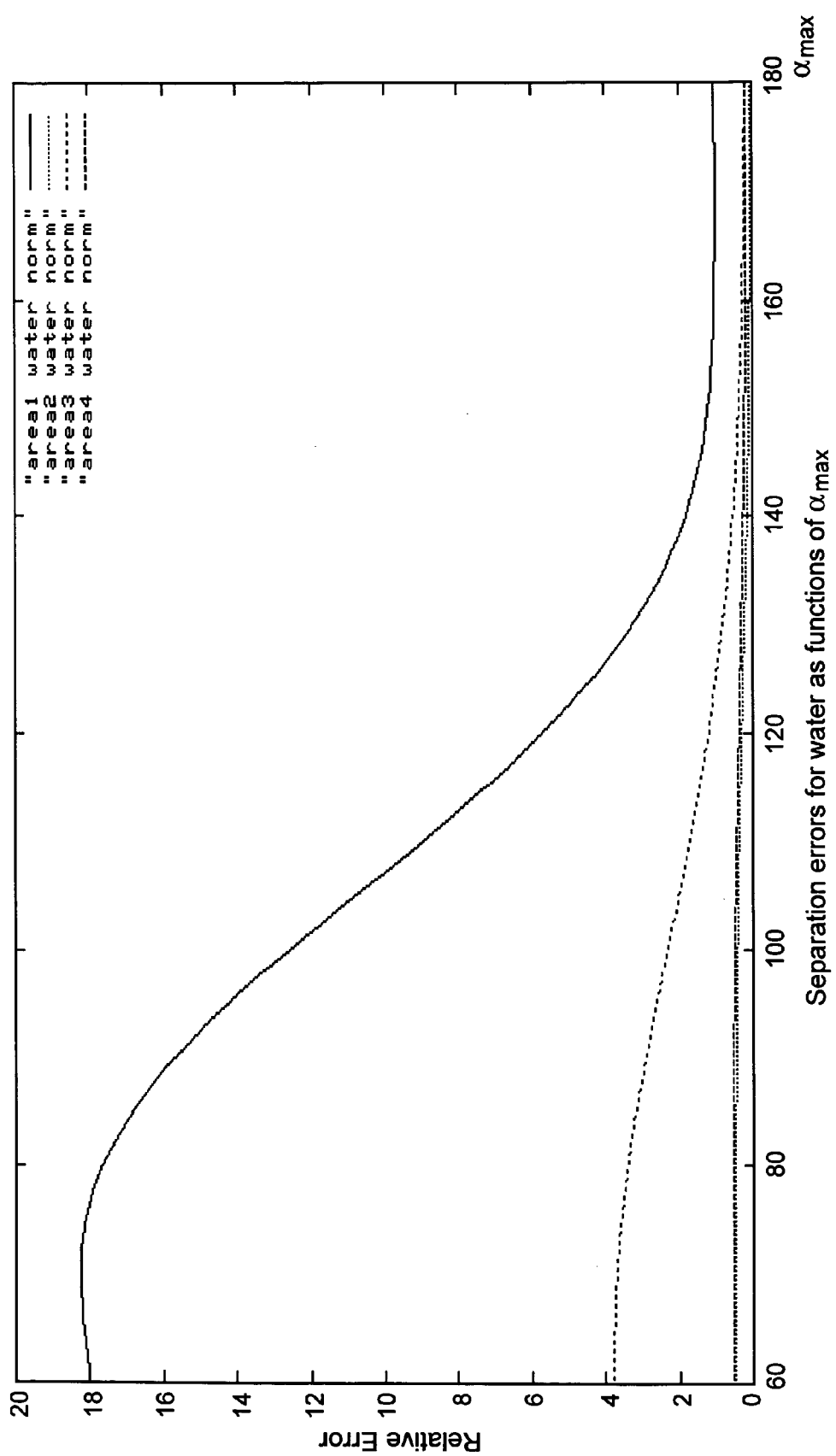

FIGS. 11 and 12 present calculated relative errors of the water/fat separation as functions of $α_{max}$, when a 10% noise was added to the simulated input data. Separation errors shown on FIGS. 11 and 12 suggest that for N=5, acceptable results of separation with the presence of noise can be achieved with $α_{max}$ of at least 120°.

In a second series of experiments, the distribution of increment angles (α) was varied. To normalize the results of experiments with different numbers (N) of increment angles, the effect of total acquisition time was fixed. The acquisition time is proportional to N and to the number of the signal repetitions NAQ. The signal to noise ratio (SNR) of the input signal is proportional to the square root of NAQ. To make the results of the second series experiments with different N comparable, the level of noise added to the input signal was altered. For N=5 10% noise was added; for N=4, 8.9% noise was added (square root of 4/5 times 10%); and for N=3, 7.7% noise was added (square root of 3/5 times 10%). The N=2 case was skipped because it requires a different algorithm of calculation.

The results of these experiments are presented in Tables 3, 4, and 5 below:

TABLE 1

| Noise | Area | Water error % | Fat error % | βmin | βmax |
|---|---|---|---|---|---|
| 0 | 1 | 0.07411 | 0.0168 | -1.99768 | 1.99845 |
|  | 2 | 0.0269 | 0.0656 |  |  |
|  | 3 | 0.01667 | 0.0176 |  |  |
|  | 4 | 0.0476 | 0.0222 |  |  |
| 0.5% | 1 | 800.00 | 19.0878 | -1.74231 | 2.59585 |
| (62.6) | 2 | 16.8920 | 40.0276 |  |  |
|  | 3 | 59.9941 | 6.4596 |  |  |
|  | 4 | 31.9587 | 15.3364 |  |  |

TABLE 2

| Noise | Area | Water err % | Fat err % | βmin | βmax |
|---|---|---|---|---|---|
| 1% | 1 | 9.0718 | 0.1579 | -2.00136 | 2.00764 |
| (125) | 2 | 0.7176 | 1.9633 |  |  |
|  | 3 | 2.6193 | 0.2227 |  |  |
|  | 4 | 1.1817 | 0.4973 |  |  |
| 2.5% | 1 | 60.3306 | 0.7407 | -1.96614 | 2.03325 |
| (313) | 2 | 1.9759 | 5.5355 |  |  |
|  | 3 | 3.0593 | 0.5570 |  |  |
|  | 4 | 3.0593 | 1.2770 |  |  |
| 5% | 1 | 207.0330 | 3.6643 | -1.72407 | 2.36979 |
| (625) | 2 | 7.3806 | 21.8433 |  |  |
|  | 3 | 28.2061 | 1.8792 |  |  |
|  | 4 | 12.3137 | 4.9135 |  |  |

TABLE 3

(N = 3, noise 7.7%).

| | $α_n = \{0°, 60°, 120°\}$ | | $α_n = \{0°, 90°, 120°\}$ | |
|---|---|---|---|---|
| Area | Water error % | Fat error % | Water error % | Fat error % |
| 1 | 124.797 | 10.589 | 100.000 | 10.910 |
| 2 | 19.819 | 57.828 | 14.148 | 50.56 |
| 3 | 86.021 | 5.345 | 65.014 | 3.196 |
| 4 | 28.974 | 11.975 | 22.936 | 8.562 |

TABLE 4

(N = 4, noise 8.9%)

| | $α_n = \{0°, 60°, 90°, 120°\}$ | | $α_n = \{0°, 80°, 100°, 120°\}$ | |
|---|---|---|---|---|
| Area | Water error % | Fat error % | Water error % | Fat error % |
| 1 | 100.000 | 11.284 | 359.441 | 20.747 |
| 2 | 24.371 | 65.886 | 27.969 | 68.749 |
| 3 | 84.538 | 4.784 | 118.099 | 5.600 |
| 4 | 27.070 | 10.352 | 34.184 | 12.851 |

TABLE 5

(N = 5, noise 10%)

| Area | $\alpha_n = \{0°, 30°, 60°, 90°, 120°\}$ | | $\alpha_n = \{0°, 40°, 70°, 100°, 120°\}$ | |
|---|---|---|---|---|
| | Water error % | Fat error % | Water error % | Fat error % |
| 1 | 246.418 | 13.348 | 757.472 | 30.138 |
| 2 | 34.818 | 81.945 | 40.870 | 84.783 |
| 3 | 102.764 | 6.781 | 113.939 | 6.157 |
| 4 | 38.705 | 17.500 | 43.500 | 20.000 |

Figure 13:
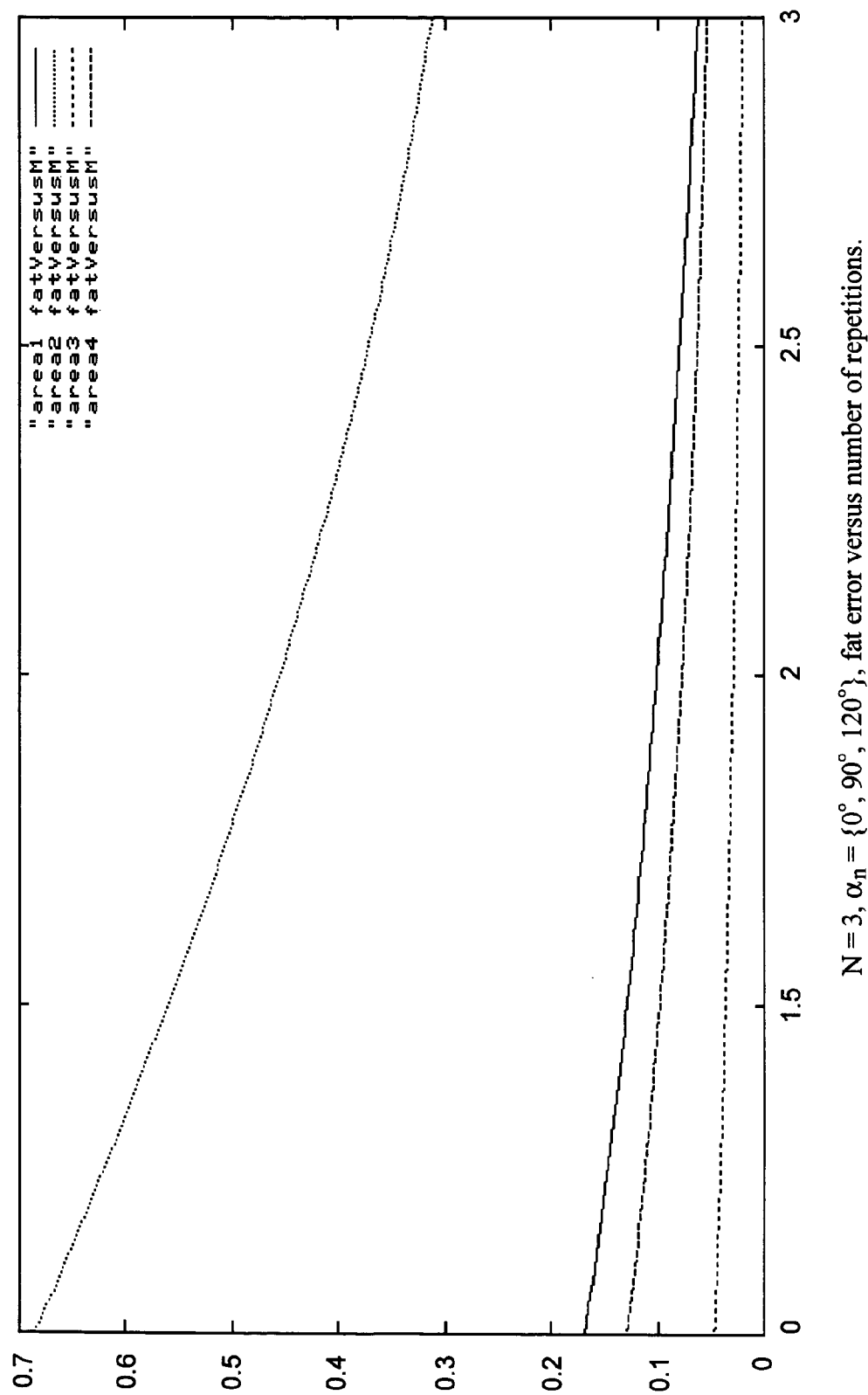
FIGS. 13 and 14 illustrate fat and water relative error versus the number of repetitions M for N=3, $\alpha_n=\{0°,90°,120°\}$.
Figure 14:
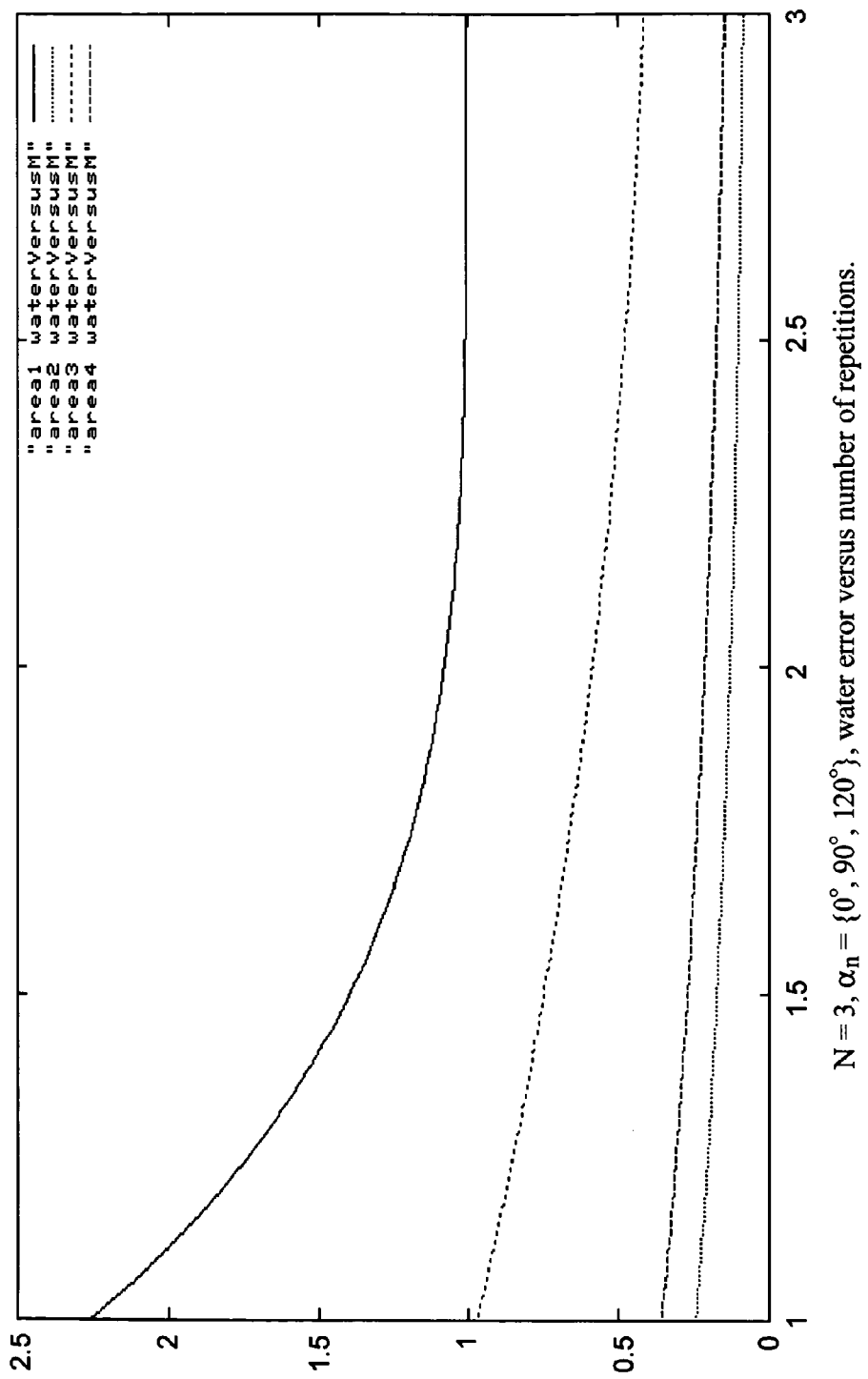
Figure 15:
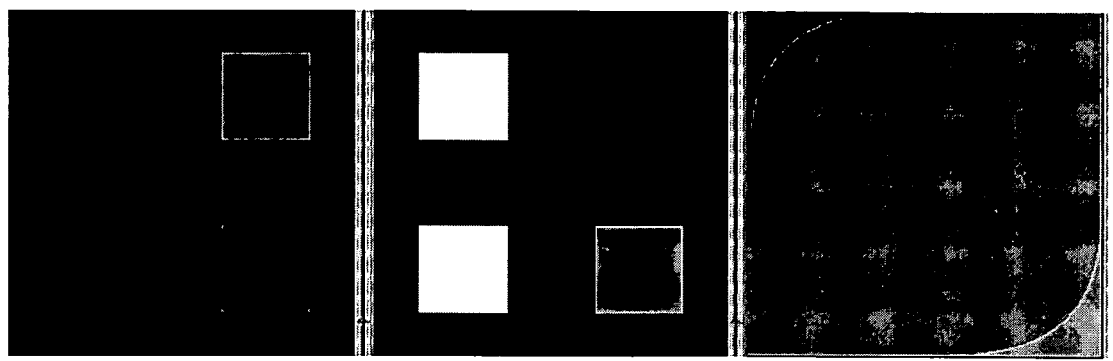
FIG. 15 illustrates water, fat and $\beta$ images for N=3 and M=3, $\alpha_n=\{0°,90°,120°\}$.

Tables 3–5 show that for the model in FIG. 3 and the proposed algorithm, the acquisition parameters N=3, $\alpha_n=\{0°,90°,120°\}$ and N=4, $\alpha_n=\{0°,60,90,120\}$ give the best results of the experiments. These results can be further improved by increasing the number of repetitions NAQ as presented in FIGS. 13 and 14. FIG. 15 presents the water, fat and β images for N=3 and NAQ=3.

Figure 16:
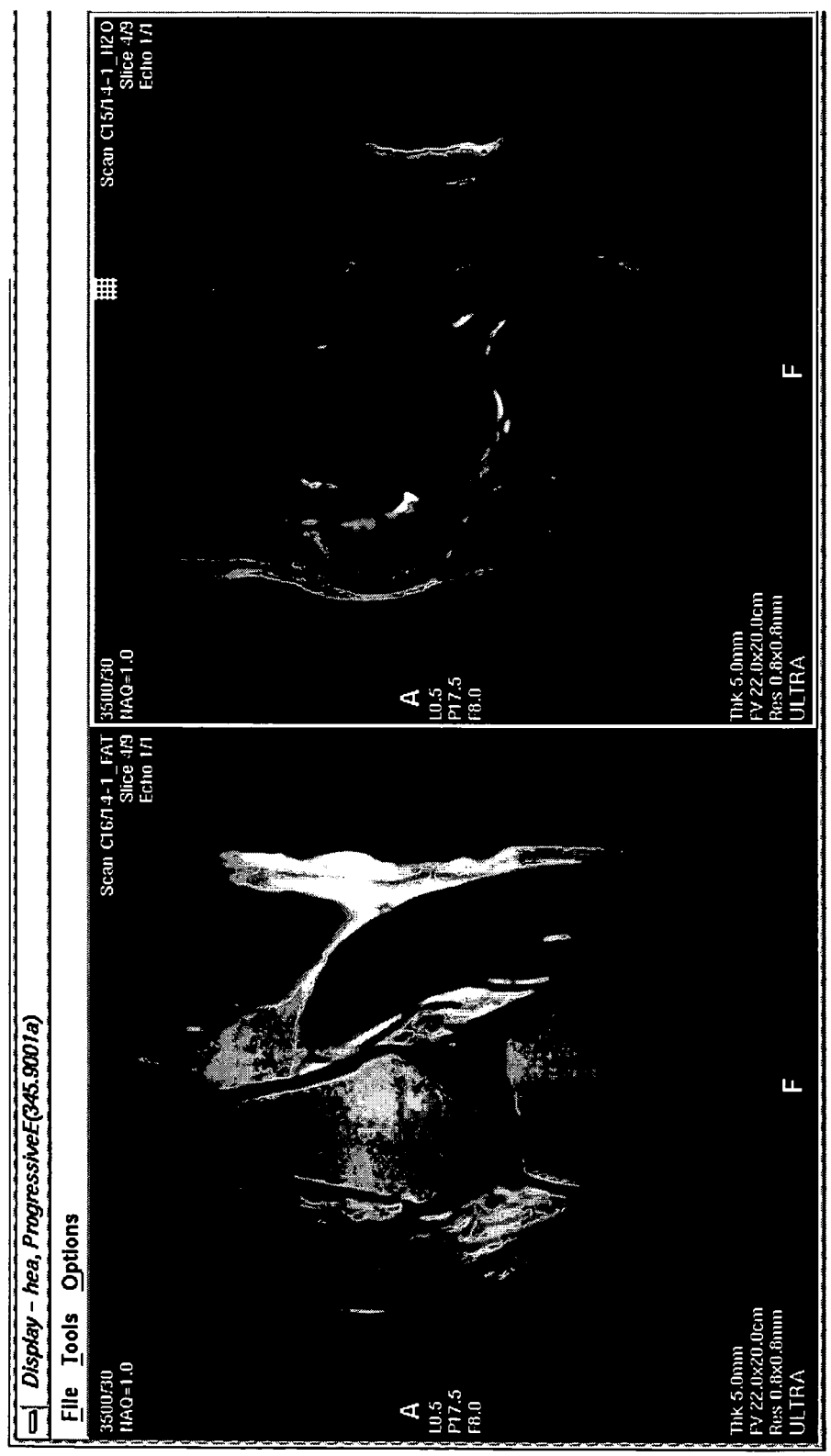
FIG. 16 illustrates sagittal water and fat images of the knee of a healthy volunteer, obtained at 0.35 T using a FSE sequence with parameters: TR=3500 msec, TE=30 msec, N=3, $\alpha_n=\{0°,90°,120°\}$.

In FIG. 16 are presented sagittal water and fat MR images of the knee of a presumed healthy volunteer. The scans were performed using a 0.35 T open MRI system with a high performance gradient subsystem. These images were obtained using a FSE_PRE sequence with the following parameters: TR=3500 msec; TE=30 msec; the phase dispersion scheme was: N=3 $\alpha_n=\{0°,90°,120°\}$ and NAQ=1. Further improvement of the images can be achieved by increasing the number of repetitions. Another method of solving the equations 2, 3 is based on the assumption that the mean value of the water to fat signal ratio taken over a reasonably big region of the area of the image for the modified FSE sequence is near to one. This fact can be used to create a reasonably good approximation of β(x,y) by applying a heavy low-pass filter to the input image signals $I_n(x,y)$.

As before, β(x,y) can be further fit by a low order polynomial, and used in the solution of equations 2,3. In particular, to separate the two chemically-shifted signal components w and f, the following image collection and process steps are performed: (i) acquire a heavy spatially low-filtered input signal ($I_n$) generated by applying a fast spin echo (FSE) sequence to an object, wherein the input signal has a relatively small and non-zero phase difference between the w and f signal components, (ii) estimating a main magnetic field inhomogeneity (β) using the heavy spatially low-pass filtered input signal ($I_n$) applied to equations B and C:

$$\cos(\alpha_n\beta)*w+\cos[\alpha_n(1+\beta)]*f=\text{real}(I_n) \quad (B)$$

$$\sin(\alpha_n\beta)*w+\sin[\alpha_n(1+\beta)]*f=\text{imaginary}(I_n) \text{ and} \quad (C)$$

(iii) apply the estimated inhomogeneity (β) to separate the w and f signals in a non-filtered MRI input signal. This method assumes that for heavy spatially low-pass filtered input signal, the w to f signal components ratio has relatively small variation over the whole input signal space.

The invention has been described in connection with what is presently considered to be the most practical and preferred embodiments. The invention is not to be limited to the disclosed embodiments, but, on the contrary, covers various modifications and equivalent arrangements included within the spirit and scope of the appended claims.

What is claimed is:

1. A method for magnetic resonance imaging of a object in which two moieties of differing chemical shifts are separated in presence of a non-uniform magnetic field, said method comprising:
    positioning the object to be imaged in a magnetic resonance imaging (MRI) device;
    acquiring at least three sets of MRI data of the object by applying a series of fast spin echo (FSE) sequences in which a readout gradient waveform is shifted to produce at least three sets of MRI data that are similarly spatially encoded, wherein the FSE sequences have different signal timing to produce three different phase shifts between two chemically shifted signals w and f in the MRI data sets, and wherein one of the MRI data sets has a phase difference ($\alpha_0$) that is substantially zero;
    generating at least three complex image data sets by reconstructing images from the at least three MRI data sets;
    using the at least three complex image data sets two at a time to generate two pairs of solutions for separate images of w and f signals having different chemical shifts, the solutions are generated according to equation A below:

$$|w+f*\exp(i\alpha_n)|=|I_n|, n=\{0, n_1\} \text{ and } n=\{0, n_2\} \quad (A)$$

where α is an induced phase shift between the w and f signals;
    from the two pairs of solutions for w and f and from equations B and C which are:

$$\cos(\alpha_n\beta)*w+\cos[\alpha_n(1+\beta)]*f=\text{real}(I_n) \quad (B)$$

$$\sin(\alpha_n\beta)*w+\sin[\alpha_n(1+\beta)]*f=\text{imaginary}(I_n) \quad (C)$$

determining two pairs of solutions ($\{\beta_1^1, \beta_1^2\}$ and $\{\beta_2^1, \beta_2^2\}$) for a main magnetic field inhomogeneity (β) wherein the solution $\{\beta_1^1, \beta_1^2\}$ is determined using the in-phase MRI data set and an MRI data set having the largest phase shift ($\alpha_{n1}$), and the solution $\{\beta_2^1, \beta_2^2\}$ is determined using the in-phase MRI data set and an MRI data set having another the second largest phase shift ($\alpha_{n2}$);
    determining a unique solution for β from $\{\beta_1^1, \beta_1^2\}$ and $\{\beta_2^1, \beta_2^2\}$ by selecting a one of $\beta_1^1$ and $\beta_1^2$ having a minimum distance among the following D):

$$|\beta_1^1-\beta_2^1|, |\beta_1^1-\beta_2^2|, |\beta_1^2-\beta_2^1|, |\beta_1^2-\beta_2^2| \quad (D)$$

and applying the selected β to determine a final result solution for at least one of the w and f signals.

2. The method for magnetic resonance imaging in claim 1 wherein the data from the sets include data sets in addition to an in-phase data set and data sets having the large and the another large phase shifts.

3. The method for magnetic resonance imaging in claim 1 wherein the object is a human.

4. The method for magnetic resonance imaging in claim 1 wherein the object is mammalian.

5. The method for magnetic resonance imaging in claim 1 wherein the w signals correspond to water and the f signals correspond to fat.

6. The method for magnetic resonance imaging in claim 1 further comprising rapidly acquiring echoes within one scan.

7. The method for magnetic resonance imaging in claim 6 further comprising acquiring the at least three echoes between each pair of 180 degree pulses by rapidly reversing the readout gradient.

8. The method for magnetic resonance imaging in claim 1 further comprising applying a gradient echo imaging pulse sequence and rapidly reversing the readout gradient to produce the requisite phase shifted echoes.

9. The method for magnetic resonance imaging in claim 1 further comprising applying rapid readout reversals in a spin echo imaging pulse sequence to produce the phase shifted echoes.

10. The method of claim 1 using three separate MR imaging scans to acquire the at least three sets of MRI data.

11. The method of claim 8 using three separate MR imaging scans to acquire the at least three sets of MRI data.

12. The method of claim 9 using three separate MR imaging scans to acquire the at least three sets of MRI data.

13. The method for magnetic resonance imaging in claim 1 further comprising acquiring more than three MRI data sets and wherein the MRI data set having the large phase shift is a data set having a largest phase shift and the another MRI data set having the another large phase shift is a data set having a second largest phase shift.

14. A magnetic resonance imaging method to separate two moieties of differing chemical shifts comprising:
   positioning an object in a magnetic resonance imaging (MRI) device, wherein the device has a non-homogeneous main magnetic field;
   applying three series of fast spin echo (FSE) sequences, each having a shifted readout gradient, to the subject to acquire three MRI data sets of similarly spatially encoded MRI data, wherein the data sets each further comprise two chemically shifted signals w and f and one of the three data sets has a substantially zero phase difference ($\alpha_0$);
   generating three complex image data sets by reconstructing images from the three MRI data sets;
   using the three complex image data sets two at a time to generate two pairs of solutions for separate images of the w and f signals, wherein the two solutions are each generated according to equation A:

$$|w+f^*\exp(i\alpha_n)|=|I_n|, \text{ where } n=\{0, 1\} \text{ and } n=\{0, 2\} \quad (A)$$

where $\alpha$ is a phase shift between the w and f signals induced by the FSE sequences;
   using the two pairs of solutions for w and f and applying equations B and C:

$$\cos(\alpha_n\beta)^*w+\cos[\alpha_n(1+\beta)]^*f=\text{real}(I_n) \quad (B)$$

$$\sin(\alpha_n\beta)^*w+\sin[\alpha_n(1+\beta)]^*f=\text{imaginary}(I_n) \quad (C)$$

to determine two pairs of solutions ($\{\beta_1^1, \beta_1^2\}$ and $\{\beta_2^1, \beta_2^2\}$) for the main magnetic field inhomogeneity ($\beta$), wherein the solution $\{\beta_1^1, \beta_1^2\}$ is determined using an in-phase MRI data set ($\alpha_0$) and an MRI data set having a large phase shift ($\alpha_1$), and the solution $\{\beta_2^1, \beta_2^2\}$ is determined using the in-phase MRI data set and another MRI data set having another large phase shift ($\alpha_2$);
   selecting a unique solution for $\beta$ from $\{\beta_1^1, \beta_1^2\}$ and $\{\beta_2^1, \beta_2^2\}$, by selecting one of $\beta_1^1$ and $\beta_1^2$ having a minimum distance among the following (D):

$$|\beta_1^1-\beta_2^1|, |\beta_1^1-\beta_2^2|, |\beta_1^2-\beta_2^1|, |\beta_1^2-\beta_2^2| \text{ and} \quad (D)$$

applying the selected $\beta$ to generate an image for at least one of the w and f signals.

15. The method for magnetic resonance imaging in claim 14 further comprising acquiring more than three MRI data sets and wherein the MRI data set having a large phase shift ($\alpha_1$) is a data set having a largest phase shift and the another MRI data set having the another large phase shift is a data set having a second largest phase shift ($\alpha_2$).

16. The method for magnetic resonance imaging in claim 14 wherein the object is a human.

17. The method for magnetic resonance imaging in claim 14 wherein the object is mammalian.

18. The method for magnetic resonance imaging in claim 14 wherein the w signals correspond to water and the f signals correspond to fat.

19. The method for magnetic resonance imaging in claim 14 further comprising rapidly acquiring echoes within one imaging scan.

20. The method for magnetic resonance imaging in claim 19 further comprising acquiring each of the three the MRI data sets from three spin echoes acquired between each pair of 180 degree pulses by rapidly reversing the readout gradient.

21. The method for magnetic resonance imaging in claim 14 further comprising applying a gradient echo imaging pulse sequence and rapidly reversing readout gradients to produce phase shifted echoes acquired for the MRI data sets.

22. The method for magnetic resonance imaging in claim 14 further comprising applying rapid readout reversals within a spin echo imaging sequence to produce the phase shifted echoes.

23. The method of claim 14 wherein a separate MR imaging scan is applied for each of the FSE sequences.

24. A method to separate two chemically-shifted signal components w and f comprising:
   acquiring a heavy spatially low-filtered input signal ($I_n$) generated by applying a fast spin echo (FSE) sequence to an object, wherein the input signal has a relatively small and non-zero phase difference between the w and f signal components,
   estimating a main magnetic field inhomogeneity ($\beta$) using the heavy spatially low-filtered input signal ($I_n$) applied to equations B and C:

$$\cos(\alpha_n\beta)^*w+\cos[\alpha_n(1+\beta)]^*f=\text{real}(I_n) \quad (B)$$

$$\sin(\alpha_n\beta)^*w+\sin[\alpha_n(1+\beta)]^*f=\text{imaginary}(I_n) \text{ and} \quad (C)$$

applying the estimated inhomogeneity ($\beta$) to separate the w and f signals in a non-filtered MRI input signal.

25. The method of claim 24 wherein the w and f signal components are assumed to be approximately equal.

26. The method of claim 24 further comprising:
   selecting the heavy spatially low-filtered input signal from input signals generated by applying three series of fast spin echo (FSE) sequences, each having a shifted readout gradient, to the subject to acquire three MRI data sets of similarly spatially encoded MRI data, wherein the data sets each further comprise the two chemically shifted signals w and f and one of the three data sets has a substantially zero phase difference ($\alpha_0$).

27. The method of claim 26 further comprising:
   generating three complex image data sets by reconstructing images from the three MRI data sets;
   using the three complex image data sets two at a time to generate two pairs of solutions for separate images of the w and f signals, wherein the two solutions are each generated according to equation A:

$$|w+f^*\exp(i\alpha_n)|=|I_n|, \text{ where } n=\{0, 1\} \text{ and } n=\{0, 2\} \quad (A)$$

where $\alpha$ is a phase shift between the w and f signals induced by the FSE sequences;
   using the two pairs of solutions for w and f and applying equations B and C to determine two pairs of solutions ($\{\beta_1^1, \beta_1^2\}$ and $\{\beta_2^1, \beta_2^2\}$) for the main magnetic field inhomogeneity ($\beta$), wherein the solution $\{\beta_1^1, \beta_1^2\}$ is determined using an in-phase MRI data set ($\alpha_0$) and an MRI data set having a large phase shift ($\alpha_1$), and the solution $\{\beta_2^1, \beta_2^2\}$ is determined using the in-phase MRI data set and another MRI data set having another large phase shift ($\alpha_2$);

selecting a unique solution for $\beta$ from $\{\beta_1^1, \beta_1^2\}$ and $\{\beta_2^1, \beta_2^2\}$, by selecting one of $\beta_1^1$ and $\beta_1^2$ having a minimum distance among the following (D):

$$|\beta_1^1 - \beta_2^1|, |\beta_1^1 - \beta_2^2|, |\beta_1^2 - \beta_2^1|, |\beta_1^2 - \beta_2^2| \text{ and} \tag{D}$$

applying the selected $\beta$ to generate an image for at least one of the w and f signals.

28. The method of claim 26 further comprising acquiring more than three MRI data sets and wherein the MRI data set having a large phase shift ($\alpha_1$) is a data set having a largest phase shift and the another MRI data set having a large phase shift ($\alpha_2$) is a data set having a second largest phase shift.

29. The method of claim 26 wherein the non-filtered MRI input signal is an imaging signal of a human.

30. The method of claim 26 wherein the w signals correspond to water and the f signals correspond to fat.

31. The method of claim 26 further comprising rapidly acquiring echoes for the heavy spatially low-filtered input signal within one imaging scan.

* * * * *